United States Patent
Noll et al.

(10) Patent No.: US 11,113,934 B2
(45) Date of Patent: Sep. 7, 2021

(54) ENCODING/DECODING APPARATUSES AND METHODS FOR ENCODING/DECODING VIBROTACTILE SIGNALS

(71) Applicant: Technische Universität München, Munich (DE)

(72) Inventors: Andreas Noll, Munich (DE); Basak Gülecyüz, Munich (DE); Eckehard Steinbach, Olching (DE)

(73) Assignee: TECHNISCHE UNIVERSITÄT MÜNCHEN, Munich (DE)

( * ) Notice: Subject to any disclaimer, the term of this patent is extended or adjusted under 35 U.S.C. 154(b) by 0 days.

(21) Appl. No.: 16/833,403

(22) Filed: Mar. 27, 2020

(65) Prior Publication Data
US 2020/0312103 A1 Oct. 1, 2020

(30) Foreign Application Priority Data
Mar. 29, 2019 (DE) .......................... 102019204527.8

(51) Int. Cl.
*H03M 7/30* (2006.01)
*G08B 6/00* (2006.01)

(52) U.S. Cl.
CPC ................ *G08B 6/00* (2013.01); *H03M 7/30* (2013.01)

(58) Field of Classification Search
CPC .................................. G08B 6/00; H03M 7/30
USPC ......................................................... 341/87
See application file for complete search history.

(56) References Cited

U.S. PATENT DOCUMENTS

| 5,819,215 A | * | 10/1998 | Dobson | G06T 9/007 704/230 |
| 5,845,243 A | * | 12/1998 | Smart | G06T 9/007 704/200.1 |
| 6,853,318 B1 | * | 2/2005 | Rabbani | H04N 19/61 341/50 |

(Continued)

OTHER PUBLICATIONS

"A Simple 9/7-TAP Wavelet Filter Based on Lifting Scheme", pp. 249-252, IEEE, 2001. (Year: 2001).*

(Continued)

*Primary Examiner* — Jean B Jeanglaude
(74) *Attorney, Agent, or Firm* — Jenkins, Wilson, Taylor & Hunt, P.A.

(57) ABSTRACT

An encoding apparatus for encoding a vibrotactile signal includes a first transforming unit configured to perform a discrete wavelet transform of the signal, a second transforming unit configured to generate a frequency domain representation of the signal, a psychohaptic model unit configured to generate at least one quantization control signal based on the generated frequency domain representation of the sampled signal and on a predetermined perceptual model based on human haptic perception, a quantization unit configured to quantize wavelet coefficients resulting from the performed discrete wavelet transform and adapted by the quantization control signal, a compression unit configured to compress the quantized wavelet coefficients, and a bitstream generating unit configured to generate a bitstream corresponding to the encoded signal based on the compressed quantized wavelet coefficients. The subject matter described herein also includes a corresponding decoding unit, an encoding method and a decoding method.

18 Claims, 12 Drawing Sheets

(56) References Cited

U.S. PATENT DOCUMENTS

| | | | | |
|---|---|---|---|---|
| 7,006,568 | B1* | 2/2006 | Gu | H04N 19/46 348/472 |
| 7,062,104 | B2* | 6/2006 | Zeng | H04N 19/63 358/466 |
| 7,733,961 | B2* | 6/2010 | O'Hara | G06K 9/0063 375/240.19 |
| 9,008,451 | B2* | 4/2015 | Lee | H04N 19/176 382/239 |
| 9,681,140 | B2* | 6/2017 | Le Leannec | H04N 19/126 |
| 2004/0062448 | A1* | 4/2004 | Zeng | H04N 19/60 382/251 |
| 2006/0238386 | A1* | 10/2006 | Huang | G10L 19/008 341/50 |
| 2008/0131014 | A1* | 6/2008 | Lee | H04N 19/154 382/251 |
| 2016/0173884 | A1* | 6/2016 | Le Leannec | H04N 19/186 382/166 |

OTHER PUBLICATIONS

Office Action for German Patent Application Serial No. 10 2019 204 527.8 (dated Apr. 3, 2020).

Examination Notice for German Application Serial No. 10 2019 204 257.8 (dated Oct. 7, 2019).

Antonakoglou et al., "Toward Haptic Communications Over the 5G Tactile Internet," IEEE Communications Surveys & Tutorials, vol. 20, No. 4, Fourth Quarter, pp. 3034-3059 (2018).

Kuzu et al., "Wavelet packet transform-based compression for teleoperation," Proc IMechE Part I: Journal of Systems and Control Engineering, vol. 229, No. 7, pp. 639-651 (2015).

Kuschel et al., "Passive Haptic Data-Compression Methods With Perceptual Coding for Bilateral Presence Systems," IEEE Transactions on Systems, Man, and Cybernetics—Part A: Systems And Humans, vol. 39, No. 6, pp. 1142-1151 (Nov. 2009).

Chaudhari et al., "On the Compression and Rendering of Event-triggered Force Transients in Networked Virtual Environments," IEEE, pp. 1-6 (2009).

Meyer et al., "Fast Adaptive Wavelet Packet Image Compression," IEEE Transactions on Image Processing, vol. 9, No. 5, pp. 792-800 (May 2000).

Brandenburg, "MP3 and AAC Explained," Audio Engineering Society Conference: 17th International Conference: High-Quality Audio Coding, Audio Engineering Society, pp. 1-12 (1999).

"The Tactile Internet," ITU-T Technology Watch Report, 24 pages (Aug. 2014).

* cited by examiner

ENCODING/DECODING APPARATUSES AND METHODS FOR ENCODING/DECODING VIBROTACTILE SIGNALS

PRIORITY CLAIM

This application claims the benefit of German Patent Application No. 102019204527.8, filed Mar. 29, 2019, the disclosure of which is incorporated herein by reference in its entirety.

FIELD OF THE INVENTION

The present invention relates to an encoding apparatus and a decoding apparatus for encoding or decoding a vibrotactile signal. Furthermore, the present invention relates to an encoding method and a decoding method for a vibrotactile signal. In addition, the present invention relates to a transmitter and a receiver in a communication system comprising an encoding or decoding apparatus. Besides, the present invention relates to a computer program comprising instructions which, when the program is executed by a computer, cause the computer to carry out the encoding or decoding method The invention has particular applications in the Internet of Things (IoT). However, the encoding/decoding apparatuses and methods of the invention are also usable in other fields in which signals that are generated by a tactile sensor need to be transmitted between a transmitter comprising the encoding apparatus and a receiver comprising the decoding apparatus.

BACKGROUND OF THE INVENTION

The Tactile Internet will be the next revolution of the Internet of Things (IoT) encompassing human-to-machine and machine-to-machine interactions. It will enable real-time interactive systems with a great variety of industrial, societal and business use cases. In particular, the tactile internet has emerged as a promising field for future applications of the internet. One of the visions in this context is to enable the sense of touch to be transmittable.

The Tactile Internet is defined (ITU) as an internet network that combines ultra-low latency with extremely high availability, reliability and security. Whilst the mobile internet of current 5G technology already allows the exchange of data and multimedia content on the move, IoT is enabling the interconnection of smart devices. One demand on the Tactile Internet is that it should enable the control of the IoT devices in real time. This adds a new dimension to human-to-machine interaction by enabling tactile and haptic sensations and at the same time it will allow the interaction of machines.

Hence, the Tactile Internet will enable humans and machines to interact with their environment in real time while on the move and within a certain spatial communication range. The tactile Internet will also enable haptic interaction with visual feedback. Here, the term haptic relates to the sensation of touch, in particular, the perception and manipulation of objects using touch and proprioception. Proprioception is the sense of the relative positioning of the parts of one's body and the strength of effort used in movement.

Since the Tactile Internet, as the word "tactile" includes, is based on "touch" or "perception of touch" by humans, not only visual and/or acoustic data (visual feedback) has to be transmitted between a transmitter and a receiver, but also the touch signals or sensation signals themselves typically generated by a tactile sensor (hereinafter denoted "vibrotactile signals"). For example, when a touch sensation is to be transmitted between a transmitter and a receiver, the touch sensation when a user moves a finger over a rough surface, can be detected by an accelerometer or other measuring units which generate the vibrotactile signal. The signal is "vibro" because the touch sensation typically generates a signal which consists of vibrations during a movement or touch action. This signal or these signals are ND converted, encoded and transmitted to the receiver side where e.g. a corresponding actuator is to regenerate a sensation for the user at the receiver side. The user sensation on the receiver side should exactly mimic the sensation created by the user on the transmitter side. In this manner, the sensation on the transmitter side and the receiver side should be the same.

In other cases, in the IoT, a user on the transmitter side of the network is to control a machine on the receiver side (man-to-machine interaction), and in this case, accuracy of the generated sensation on the receiver side should also mimic exactly the sensation on the created transmitter side. New application cases are, for example within virtual reality and augmented reality and other fields.

Therefore, also considering the real-time aspect of the IoT, two aspects are important when transmitting vibrotactical signals between transmitter and receiver. One aspect is the amount of data to be transferred in real time, and the second aspect is how disturbances created on the transmission path or disturbances (noise) created when generating the signals may influence the transmission and accuracy and possibly cause the receiving sensation to be mismatched to the transmitting sensation.

Therefore, sophisticated encoders and decoders need to be used on the transmission side and the receiving side.

DESCRIPTION OF THE PRIOR ART

The encoding and decoding of signals to cause visual and acoustic effects on the receiver side to be matched to the corresponding ones on the transmitter side are, for example, known from previous standards in MP3 (acoustic/audio) or JPEG (visual). The basic concept of MP3 and JPEG is to not transmit and encode/decode the entire frequency spectrum but to subdivide the frequency spectrum into several bands which are individually coded and transmitted. The MP3 standard is particularly directed to processing of acoustic signals with their specific properties so as to get rid of redundant information and only transmit useful information in order to reduce the amount of data to be transmitted. A similar concept is used with a different kind of encoder in JPEG, as explained below.

Similar to audio and video transmission, the present invention aims to enable the recording and playback of surfaces or objects across distance. An efficient encoder/decoder apparatus is crucial for achieving this goal, as the amount of data to be transmitted needs to be reduced. However, MPEG and JPEG are specifically geared to audio and video transmission and are not suitable for use with tactile or vibrotactile signals.

MPEG Layer-3 and AAC employ sophisticated audio codecs. In principle, such coders apply a filter bank to input signal blocks, wherein the filter splits these into e.g. 32 frequency bands. These sub-band signals are then transformed by an MDCT (Modified Discrete Cosine Transformation). In parallel a psychoacoustic model aims to extract information from the input signal and controls the MDCT as well as the subsequent quantizer which processes the output coefficients of the MDCT. After the quantizer there is a Huffman coding stage which further reduces redundancy. AAC has extended the principle of MPEG Layer-3 to allow for more flexibility and even better compression performance. More details about the working principle of these codecs can be found in the literature PA1 below.

However, applying these audio codecs to vibrotactile input signals is not possible in a straightforward manner. Even with slight modifications to enable the codec to work on vibrotactile signals it produces insufficient results. This is due to the fact that many elements of the codec are tailored for audio signals but not for vibrotactile signals. For example, the 32 sub-band filterbank with equally sized frequency ranges does not account for the general structure of vibrotactile signals. Also the encoder parameters, which have been chosen for audio signals with a sampling frequency of around 44.8 kHz produce long delay and high inaccuracy for vibrotactile signals since these have a sampling frequency typically in the range of 2-4 kHz.

Regarding image compression (visual), JPEG and JPEG2000 are amongst the widest used and sophisticated compression procedures. JPEG2000 operates on image blocks by first taking the DWT (Discrete Wavelet Transform) of them. Then the blocks are quantized using a fixed scalar quantizer. The wavelet coefficients in each band are scaled by empirically determined scale factors. These scale factors are independent of the input signal and are derived from human visual perception. After quantization an algorithm called EBCOT further removes redundancy and compresses even further. More details on the working principle of JPEG2000 can also be found in the literature PA2 below.

However, adapting or using JPEG2000 to make it work on vibrotactile signals would lead to poor compression performance. That is because images and vibrotactile signals differ greatly in their general structure and the way they are perceived by humans. A signal-independent quantization is not suitable for the latter kind of signals, since it is unable to account for phenomena such as masking. In addition, JPEG2000 is designed for images, where the entire signal is available at once. Vibrotactile signals on the other hand are signals over time, meaning that all operations have to be in-situ.

LIST OF PRIOR ART REFERENCES

[PA1] K. Brandenburg, "MP3 and AAC explained." Audio Engineering Society Conference: 17th International Conference: High-Quality Audio Coding. Audio Engineering Society, 1999.
[PA2] D. S. Taubman and M. W. Marcellin, "JPEG2000: Image compression fundamentals, standards, and practice", Kluwer Academic, 2002.

OBJECT OF THE PRESENT INVENTION

As explained above, there exists no straightforward solution of compressing vibrotactile signals with acceptable performance because of the specific properties of the vibrotactile signals which are essentially signals which result from vibrations caused when moving. Also, the specific disadvantages when using MP3 and JPEG coders is that they cause high distortion and cause high amount of data to be transmitted. Therefore, the object of the present invention is to provide a method and apparatus for encoding/decoding of vibrotactile signals which overcome these disadvantages. In particular, the object of the present invention is to provide an encoding apparatus/method and a decoding apparatus/method which enable an efficient and high quality compression of vibrotactile signals.

SUMMARY OF THE INVENTION

This object is solved by an encoding apparatus. This encoding apparatus for encoding a vibrotactile signal comprises a first transforming unit configured to perform a discrete wavelet transform of the signal, a second transforming unit configured to generate a frequency domain representation of the signal, a psychohaptic model unit configured to generate at least one quantization control signal based on the generated frequency domain representation of the sampled signal and on a predetermined perceptual model based on human haptic perception, a quantization unit configured to quantize wavelet coefficients resulting from the performed discrete wavelet transform and adapted by the quantization control signal, a compression unit configured to compress the quantized wavelet coefficients, and a bitstream generating unit configured to generate a bitstream corresponding to the encoded signal based on the compressed quantized wavelet coefficients.

Furthermore, this object is solved by a decoding apparatus. This decoding apparatus for decoding a vibrotactile signal from a bitstream comprises a decompression unit configured to decompress the bitstream, wherein in particular an algorithm based on inverse set partitioning in hierarchical trees is provided for the decompression, a dequantization unit configured to dequantize the decompressed bitstream and a third transforming unit configured to perform an inverse discrete wavelet transform of the dequantized bitstream.

Furthermore, this object is solved by an encoding method. This encoding method for encoding a vibrotactile signal comprises the steps of: performing a discrete wavelet transform of the signal; generating a frequency domain representation of the signal; generating at least one quantization control signal based on the generated frequency domain representation of the signal and on a predetermined perceptual model based on human haptic perception; quantizing wavelet coefficients resulting from the performed discrete wavelet transform and adapted by the quantization control signal, compressing the quantized wavelet coefficients, and generating a bitstream corresponding to the encoded signal based on the compressed quantized wavelet coefficients.

Furthermore, this object is solved by a decoding method. This decoding method for decoding a vibrotactile signal from a bitstream comprises the steps of: decompressing the bitstream, wherein in particular an algorithm based on inverse set partitioning in hierarchical trees is provided for the decompression, dequantizing the decompressed bitstream, and performing an inverse discrete wavelet transform of the dequantized bitstream.

Furthermore, this object is solved by a transmitter in a communication system comprising the encoding apparatus described herein.

Furthermore, this object is solved by a receiver in a communication system comprising the decoding apparatus described herein.

Furthermore, this object is solved by a computer program comprising instructions which, when the program is executed by a computer, cause the computer to carry out the method for decoding a vibrotactile signal from a bitstream described herein.

Further advantageous embodiments and improvements of the invention are listed in the dependent claims.

For example, it is particularly advantageous that the encoding apparatus of the present invention comprises further a block unit configured to split the collected signal into a plurality of consecutive blocks.

In a preferable embodiment of the encoding apparatus of the present invention, the first transforming unit is adapted to perform the discrete wavelet transform by using a biorthogonal wavelet, in particular a Cohen-Daubechies-Feauveau-wavelet, particularly preferred a 9/7-Cohen-Daubechies-Feauveau-wavelet.

In a further preferable embodiment of the encoding apparatus of the present invention, the second transforming unit is configured to generate the frequency domain representation by using a discrete Fourier transform, a fast Fourier transform, a discrete cosine transform or a discrete sine transform of the sampled signal.

In a further preferable embodiment of the encoding apparatus of the present invention, the psychohaptic model unit is configured to identify peaks in the signal spectrum, wherein each peak corresponds to a frequency and a magnitude, and wherein psychohaptic model unit comprises a memory adapted to store the frequency and magnitude of each identified peak.

In a further preferable embodiment of the encoding apparatus of the present invention, the psychohaptic model unit is configured to compute a masking threshold for the peaks at different frequencies based on the frequency and magnitude of each peak.

In a further preferable embodiment of the encoding apparatus of the present invention, the psychohaptic model unit is further configured to compute an absolute threshold of perception at different frequencies which corresponds to a signal magnitude, in particular an average signal magnitude, required for human at a certain frequency to be able to perceive a signal.

In a further preferable embodiment of the encoding apparatus of the present invention, the psychohaptic model unit is further configured to compute a global masking threshold based on the masking threshold and the absolute threshold.

In a further preferable embodiment of the encoding apparatus of the present invention, the psychohaptic model unit is configured to compute a signal-to-mask-ratio based on the sum of the energy of the global masking threshold at different frequencies and on the energy of the signal, in particular to compute the signal-to-mask-ratio for each frequency band of the wavelet coefficients of the discrete wavelet transform.

In a further preferable embodiment of the encoding apparatus of the present invention, the quantization unit is configured to quantize wavelet coefficients by allocating bits for each frequency band of the wavelet coefficients based on a mask-to-noise-ratio, wherein the mask-to-noise-ratio is computed based on the signal-to-mask-ratio and a signal-to-noise-ratio which is computed based on the energy of the signal and the energy of a noise introduced by the quantization.

In a further preferable embodiment of the encoding apparatus of the present invention, the compression unit is adapted to use an algorithm based on set partitioning in hierarchical trees for the compression of wavelet coefficients.

In a further preferable embodiment of the encoding apparatus of the present invention, the quantization unit (10) is configured to be adapted by the quantization control signal such that the distortion introduced during the quantization to the sampled signal in different frequency ranges is, relative to a perception masking threshold of the perception model, not perceivable by a human.

In a further preferable embodiment of the encoding apparatus of the present invention, the quantization unit comprises an embedded deadzone quantizer.

As explained above, in the present invention, the encoding and decoding methods and apparatuses on the transmitting side (encoder side) and on the receiving side (decoder side) use a special psychohaptic model in order to influence the setting of bits in the quantizer such that the decoded vibrotactical signals are better matched to the touch or tactile sensation on the transmitter side and the amount of data to be transmitted is reduced.

BRIEF DESCRIPTION OF THE DRAWINGS

Hereinafter, the invention will be described with reference to its advantageous embodiments with reference to the drawings. These drawings, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

In the drawings.

PRINCIPLE OF THE PRESENT INVENTION

The present invention proposes a tactile codec. Essentially, the proposed codec uses a perceptual approach with a DWT and subsequent quantization. The quantizer is designed to be adaptive considering a psychohaptic model. After quantization there is used a SPIHT algorithm to generate the bitstream to be transmitted. The entire process is modular, hence the encoder can work with any psychohaptic model (although a specific model is also described below in one embodiment). This allows for future enhancements.

DESCRIPTION OF THE EMBODIMENTS OF THE INVENTION

Figure 1:
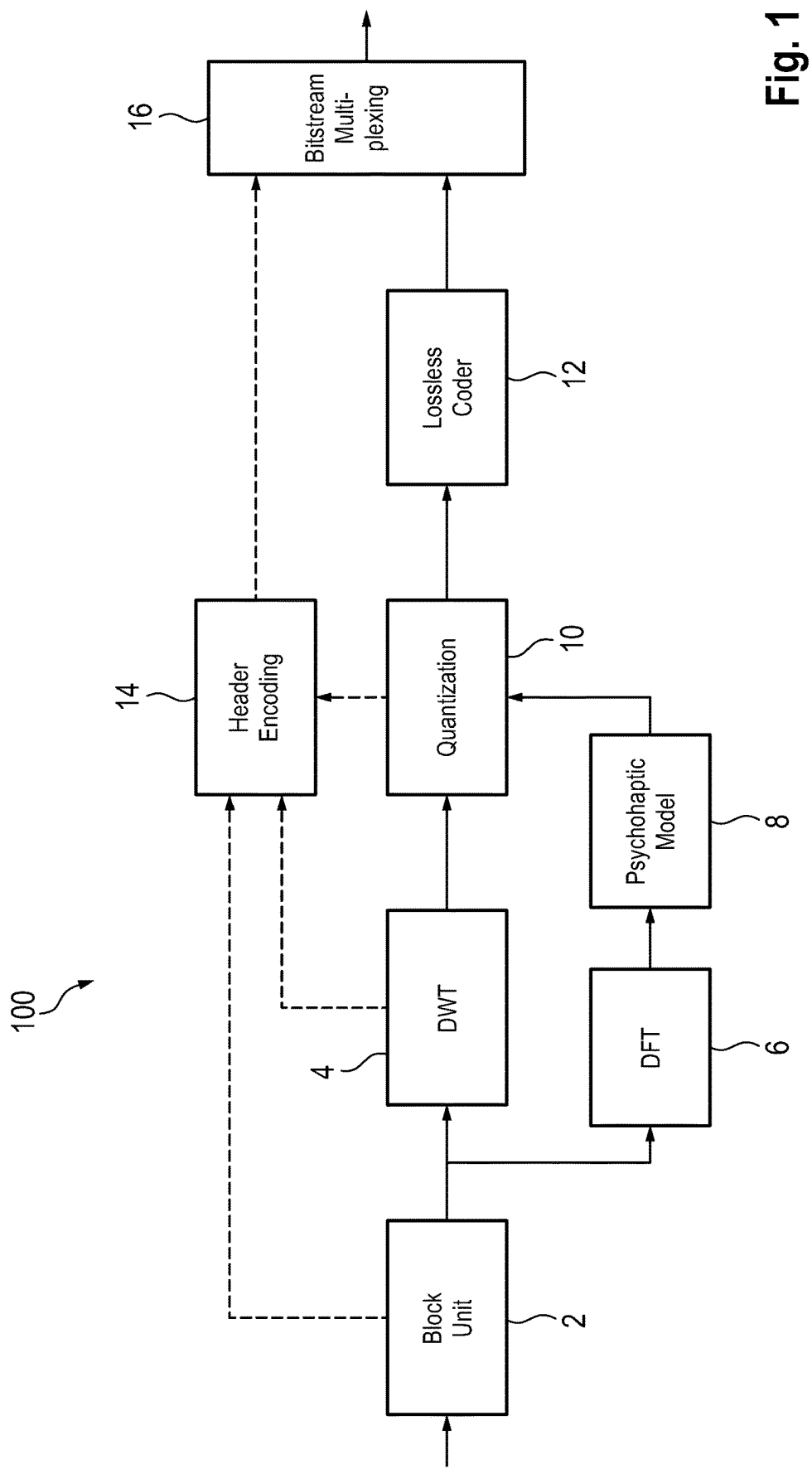
FIG. 1 shows an encoding apparatus according to one embodiment of the invention.

FIG. 1 shows an encoding apparatus according to one embodiment of the invention. As shown in FIG. 1, the encoding apparatus 100 comprises a block unit 2 configured to split a sampled signal collected by a tactile sensor, i.e. a vibrotactile signal, into a plurality of consecutive blocks, a first transforming unit 4 configured to perform a discrete wavelet transform (DWT) of the sampled signal and a second transforming unit 6 configured to perform a discrete Fourier transform (DFT) in order to generate a frequency domain representation of the sampled signal.

The encoding apparatus 100 comprises further a psychohaptic model unit 8 configured to generate at least one quantization control signal based on the generated frequency domain representation of the sampled signal and on a predetermined perceptual model based on human haptic perception, a quantization unit 10 configured to quantize wavelet coefficients resulting from the performed discrete wavelet transform and adapted by the quantization control signal and a compression unit 12 configured to compress the quantized wavelet coefficients.

The psychohaptic model of human haptic perception is essentially describing how a human being perceives touch or vibrations. It has been researched and investigated for different model assumptions that touch sensation (haptic) perceived by a human is frequency-dependent and amplitude-dependent. That is, the intrinsic model of human haptic perception is first of all based on a (measured) threshold amplitude necessary to cause a sensation dependent on frequency. However, it has also been found that this frequency-dependent sensation threshold is not independent from the actual frequency spectrum of the sensed (vibrotactile) signal (a signal which is generated as a result of vibration, as explained above). This is due to masking effects (as further explained below) due to the different input frequencies and the (measured) threshold. Hence, the psychohaptic model describes how, dependent on the input frequency spectrum, the theoretical frequency-dependent sensation amplitude threshold is modified into a modified frequency-dependent amplitude threshold which represents the amplitude magnitude at a particular frequency that is really needed to cause a sensation at each frequency for the particular input signal considered.

It is one aspect of the present invention that such a modified threshold (hereinafter "masking threshold") which already takes into account (is modified by) the input signal (frequency spectrum) through a particularly selected psychohaptic model (which describes how the theoretical threshold is modified into the real masking threshold) is used for allocation of bits in the quantizer by a quantization control signal. The quantization control signal is based on the frequency-dependent masking (modified by the psychohaptic model used) threshold and, since the quantizer operates/quantizes in different frequency bands, it can use this information on the threshold (amplitude) in each frequency region to make the allocation of the number of allocated bits among the different frequency bands adaptable on the sensation masking threshold. Since the modified (masking) threshold represents the real sensation/perception of the human for that particular vibrotactile input signal dependent on frequency, the allocation of bits in each frequency band becomes perception dependent. This applies also in a dynamic fashion, i.e. when the signal changes over time, the spectrum changes, the threshold changes dependent on the model which describes how the threshold is modified dependent on frequency and amplitude, and consequently also the allocation of bits in each frequency band may change dynamically.

Since essentially the amplitude perception threshold in each frequency band is now known, the quantization control signal distributes the available bits among the different frequency bands in such a manner that the noise/distortion (invariably introduced by the quantizer when quantizing in each frequency band) is not perceivable as much as possible (dependent on the available number of bits). That is, the quantization control signal provides the threshold for the concerned frequency band and the quantizer then looks at the quantization noise level (i.e. the distortion) in this frequency range and allocates as many bits as possible to bring the noise level below or at least as close as possible to the threshold in that very frequency range. This is possible because more bits (of the available number of bits) in a particular frequency range cause less noise and less cause more noise.

It is a second aspect of the present invention that the modified masking threshold (modified by a (any) psychohaptic model based on the modification of the theoretical threshold by the input spectrum) makes the bit allocation variable in the frequency bands such that the distortion introduced to the sampled signal during the quantization is not, relative to the perception masking threshold in that frequency range, perceivable by a human. This reduces the amount of data to be transmitted or, to put it differently, only usable data of the signal adapted to human perception is transmitted/encoded with low noise.

Hereinafter, a special embodiment of the creation and use of a psychohaptic model for a threshold dependent noise adjustment and bit allocation is described below.

The compression unit 12 may adopt any lossless compression that allows the original data to be perfectly reconstructed from the compressed data. In particular, an algorithm based on set partitioning in hierarchical trees is provided for the compression process.

The encoding apparatus 100 further comprises a header encoding unit 14 configured to add a header at the front of every compressed block to incorporate some side information in a bitstream corresponding to the encoded signal such that a corresponding decoder is able to decompress the signal correctly. In addition, the encoding apparatus 100 comprises a bitstream generating unit 16 configured to generate the bitstream based on the compressed quantized wavelet coefficients and on the header with side information.

The header added by the header encoding unit 14 shown in FIG. 1 consists of up to 30 bits for a block of 512 samples and codes the following information:
1-4 bits: Block length,
14 bits: Length of the following bitstream segment belonging to one block,
4 bits: Integer number coding the maximum number of bits allocated to the DWT bands,
8 bits: Fixed point number coding the maximum wavelet coefficient value of the current block (plus 1 signal bit).

In a further preferred embodiment not shown, the signal is split by the block unit 2 into smaller blocks with smaller block lengths. Accordingly, the length of the header is reduced. The block length on which the encoding apparatus operates can be chosen as 32, 64, 128, 256 or 512 input signal samples. To signal this to the corresponding decoding apparatus, a coding with variable bit length is employed. A code of 1 corresponds to a block length of 32, a code of 01 corresponds to a block length of 64, a code of 001 corresponds to a block length of 128, a code of 0001 corresponds to a block length of 256, and a code of 0000 corresponds to a block length of 512.

The first transforming unit 4 shown in FIG. 1 is configured to perform a DWT operating on the blocks by applying filters based on 9/7-Cohen-Daubechies-Feauveau-wavelet (9/7-CDF-wavelet). These filters are chosen as they have a symmetric impulse response, which implies a linear phase. Therefore, the same number of wavelet coefficients in each block is achieved when signal values have been inputted. In addition, the 9/7-CDF-wavelet-filters are almost orthogonal, which leads to an acceptable accuracy when calculating signal energy values in the wavelet domain.

The number of levels of the DWT $l_{DWT}$ is given by the following equation:

$$l_{DWT} = \begin{cases} 4 & L_B = 32 \\ \log_2(L_B) - 2 & L_B \in \{64, 128, 256, 512\} \end{cases},$$

wherein $L_B$ represents the block length. Thus, for a longer block length $L_B$, the number of levels of the DWT $l_{DWT}$ is increased in order to achieve a better decorrelation performance.

Before the psychohaptic model is applied, a DFT of length $2L_B$ of the current signal block is performed. Afterwards, the result is normalized by $\sqrt{L_B}$ such that it is able to directly compute energy in the spectral domain. Thereafter, the spectrum is cut to the original block length $L_B$ again to obtain a single-sided spectrum. Thereby, a direct mapping of spectral values to wavelet coefficients is achieved.

Figure 2:
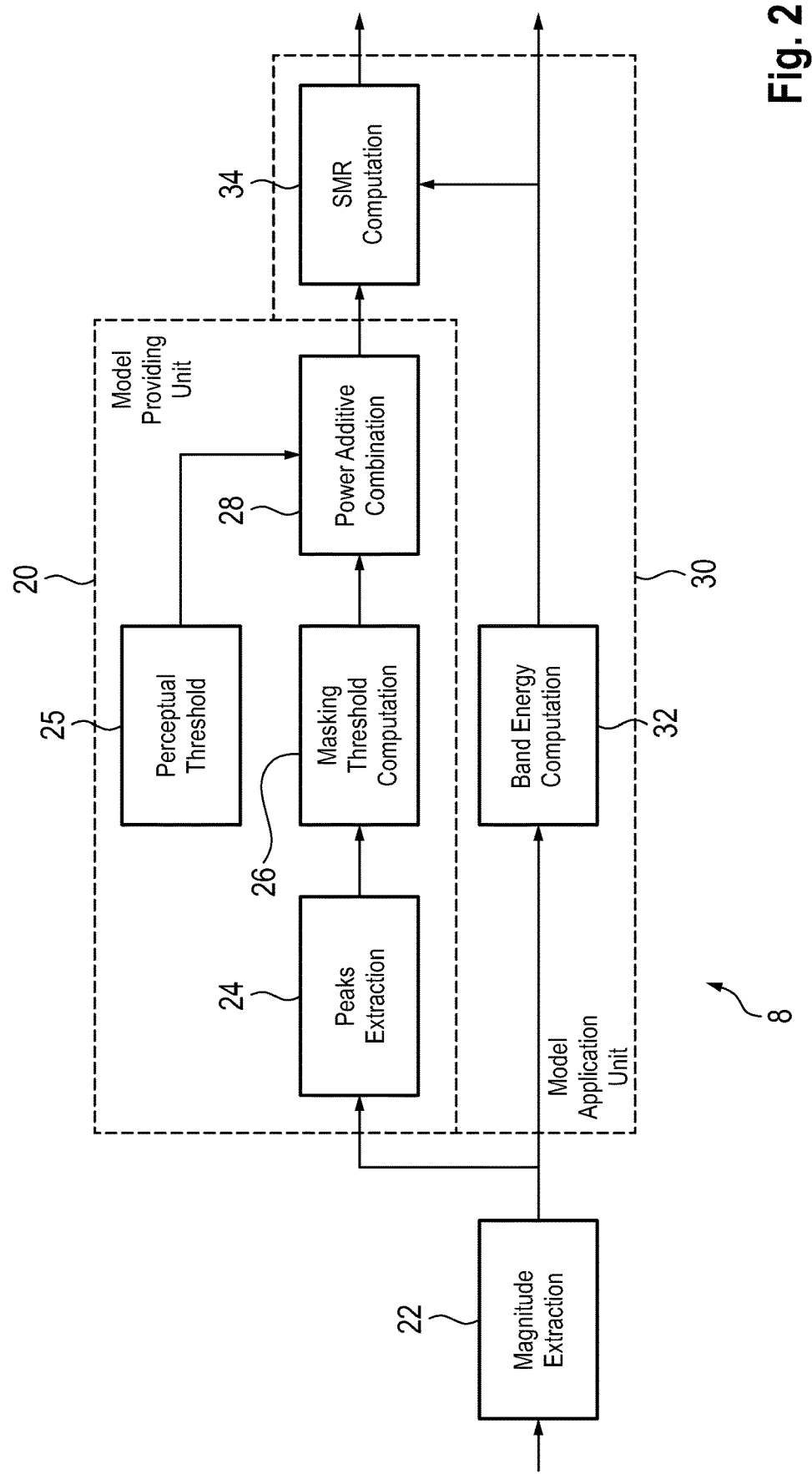
FIG. 2 shows the internal elements of the psychohaptic model unit 8 of the embodiment of the present encoding apparatus 100 shown in FIG. 1.

FIG. 2 shows the internal elements of the psychohaptic model unit 8 of the embodiment of the present encoding apparatus 100 shown in FIG. 1. This psychohaptic model unit 8 aims at adapting the quantization unit 10 to introduce distortion where it is least perceivable and comprises a model providing unit 20, a model application unit 30 and a magnitude extraction unit 22 configured to extract the magnitude of the signal after performing DFT thereof and represent the result in dB.

The model providing unit 20 comprises a peaks extraction subunit 24, a masking threshold computation subunit 26, a perceptual threshold subunit 25 and a power additive combination subunit 28. The model application unit 30 comprises a band energy computation subunit 32 and a SMR computation subunit 34.

The peaks extraction subunit 24 is configured to identify peaks based on the extracted magnitude of the signal by identifying peaks that have a certain prominence and level. In particular, the minimum prominence may be chosen as 15 dB and the minimum level as −42 dB. A minimum separation of 10 Hz between the peaks is preferred. However, it is also possible not to set the minimum separation value. Each peak corresponds to a frequency $f_p$ and a magnitude $a_p$. The psychohaptic model unit comprises a memory (not shown) adapted to store the frequency $f_p$ and magnitude $a_p$ of each identified peak.

The masking threshold computation subunit 26 is configured to compute a masking threshold for the peaks at different frequencies f based on the frequency $f_p$ and magnitude $a_p$ of each peak as well as on a sampling frequency $f_S$ of the signal of a sampling unit which is adapted for sampling of the signal. The masking thresholds $m_p(f)$ at different frequencies f for each peak are computed with the following formula:

$$m_p(f) = a_p - 5\,\text{dB} + 5\,\text{dB}\frac{2f_p}{f_S} - \frac{30\,\text{dB}}{f_p^2}(f - f_p)^2.$$

The perceptual threshold subunit 25 is configured to compute an absolute threshold of perception at different frequencies (due to the fact that humans perceive signals at different frequencies in a different way) which corresponds to a signal magnitude, in particular an average signal magnitude, required for human at a certain frequency to be able to perceive a signal. The absolute thresholds of perception t(f) at different frequencies f are computed with the following formula:

$$t(f) = \left| \frac{62}{(\log_{10}(6/11))^2}\left(\log_{10}\left(\frac{f}{550\,\text{Hz}} + \frac{6}{11}\right)\right)^2 \right| dB - 77\,\text{dB}.$$

The power additive combination subunit 28 is configured to compute a global masking threshold using power additive combination to add the absolute threshold of perception t(f) with the masking threshold $m_p(f)$.

The band energy computation subunit 32 is configured to compute the energy of the signal in each DWT band $E_{S,b}$. The SMR computation subunit 34 is configured to compute a signal-to-mask-ratio (SMR) for each DWT band based on the sum of the energy of the global masking threshold in each band $E_{M,b}$ and on the computed energy of the signal in each band $E_{S,b}$. The SMR for each band is obtained by dividing $E_{S,b}$ by $E_{M,b}$ and representing the result in dB. The SMR values for all bands are passed on to the quantization unit 10 together with the values of $E_{S,b}$.

Figure 3:
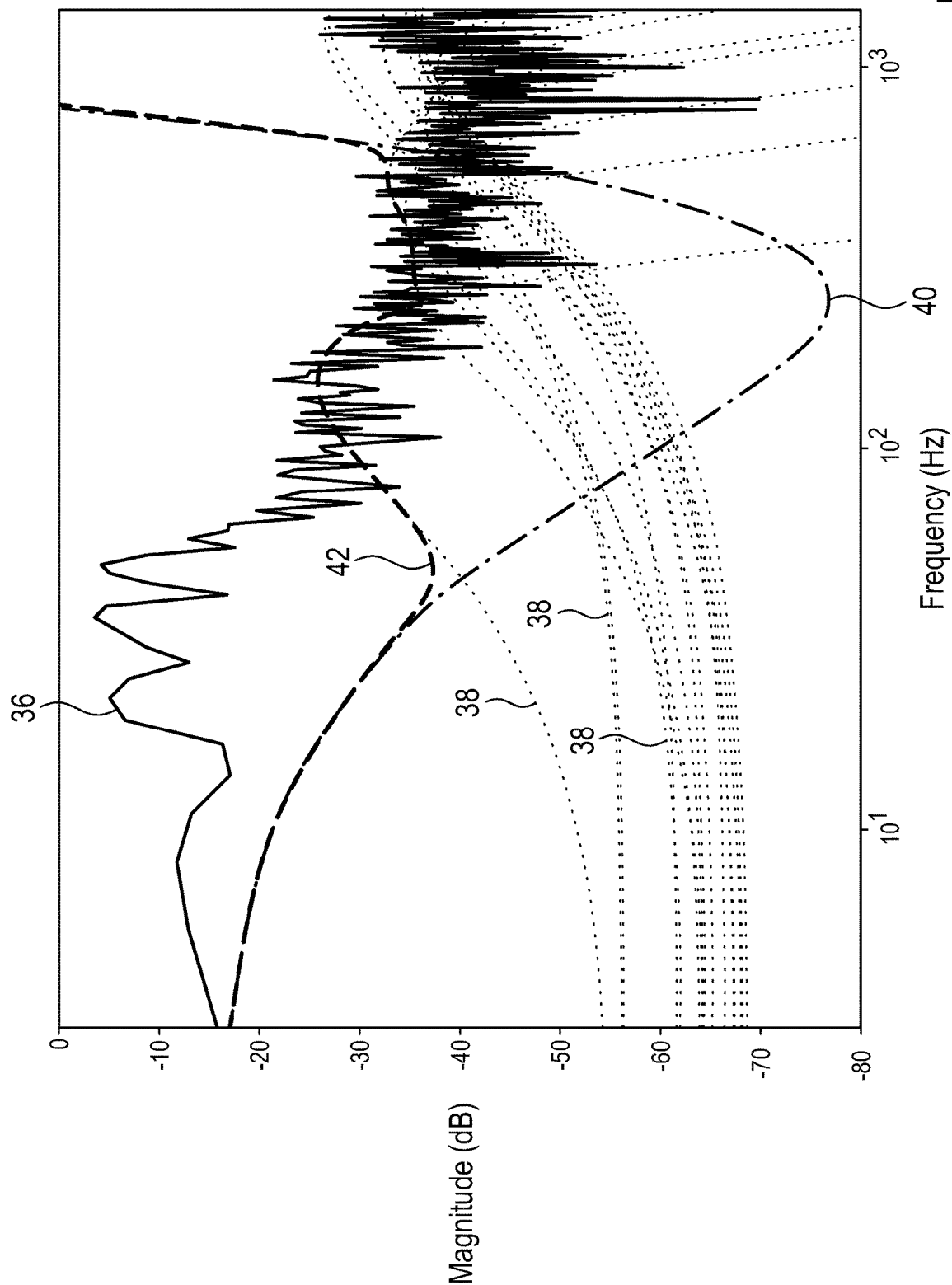
FIG. 3 shows a schematic diagram depicting the magnitude spectrum of an exemplary block, the computed masking thresholds, the computed absolute threshold of perception and the resulting global masking threshold.

FIG. 3 shows a schematic diagram depicting the magnitude spectrum of an exemplary block (shown with the solid line 36), the computed masking thresholds (shown with the broken line 38), the computed absolute threshold of perception (shown with the broken line 40) and the resulting global masking threshold (shown with the broken line 42). According to FIG. 3, the horizontal coordinate axis represents frequency in Hz and the vertical coordinate axis represents magnitude in dB. The outputs of the model providing unit 20, the model application unit 30 as well as some of their subunits are depicted there schematically.

In another preferred embodiment, encoding of the quantized wavelet coefficients of each block is performed via a 1D version of Set Partitioning in Hierarchical Trees (SPIHT) algorithm. However, the present invention is not limited to use a SPIHT algorithm, but may adopt any lossless compression algorithm which removes the redundancies of the signal and is suitable for the DWT.

Since the input of the 1D version of SPIHT algorithm is a 1D signal, SPIHT is adapted to encode 1D quantized wavelet coefficients. SPIHT is a zero tree based coding method which utilizes two types of zero trees and encodes the significant coefficients and zero trees by successive sorting and refinement passes. In SPIHT, each quantized wavelet coefficient is presented with magnitude bitplanes and a corresponding sign plane. The parent-child relationship among these coefficients are defined based on the applied DWT levels and used when encoding the bitplanes through the iterations of sorting and refinement passes.

Figure 4:
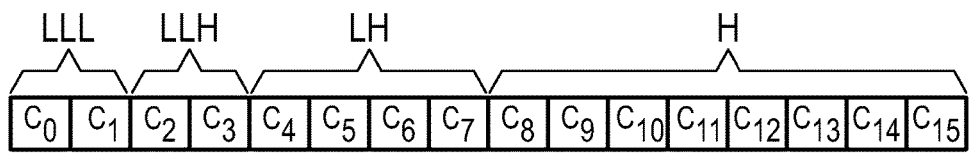
FIG. 4 shows an example of 1D wavelet coefficients of the 1D version of SPIHT algorithm.
Figure 5:
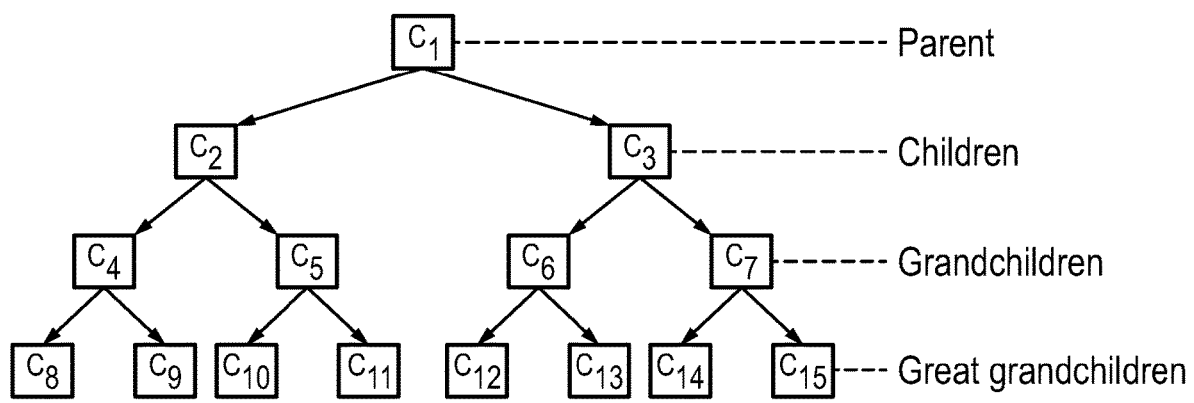
FIG. 5 shows the tree structure of the 1D version of SPIHT algorithm.

An example of the resulting 1D wavelet coefficients and the tree structure is shown in FIG. 4 and FIG. 5. For a 1D block of 16 quantized wavelet coefficients and 3 levels of DWT, the resulting frequency bands and corresponding coefficients are depicted in FIG. 4, where =1, 2, . . . , or 15) denotes the coefficient, and L and H denote the low and high frequency bands, respectively. The corresponding tree structure of the parent-child relationship among these coefficients is provided in FIG. 5.

SPIHT defines three lists, namely List of Significant Pixels (LSP), List of Insignificant Pixels (LIP), and List of Insignificant Sets (LIS). In sorting pass, the position of a coefficient is inserted into LSP when the coefficient is significant, into LIP when it is insignificant, or into LIS when the coefficients of corresponding tree are insignificant. Furthermore, the bits of coefficients in magnitude bitplane are inserted to the encoded bitstream, if the coefficient is LIP or LIS. In refinement pass, the bits in magnitude bitplane for the coefficients belonging to LSP before the last sorting pass are inserted to the encoded bitstream. These passes are repeated for each magnitude bitplane. The final output of the SPIHT module is the bitstream of lossless compression of quantized 1D DWT coefficients.

Figure 6:
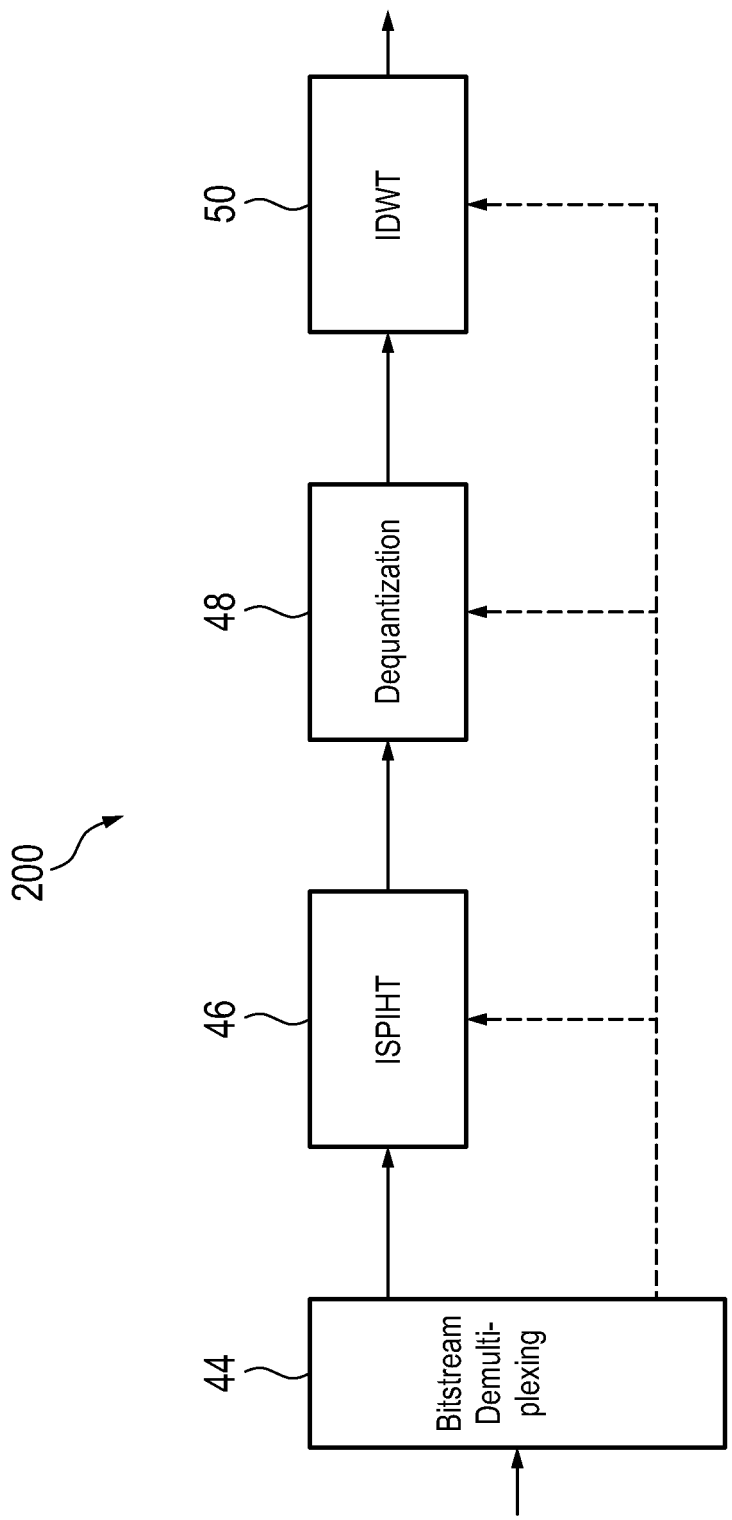
FIG. 6 shows a decoding apparatus 200 for decoding at least a signal collected by a tactile sensor from a bitstream according to one embodiment of the invention.

FIG. 6 shows a decoding apparatus 200 for decoding a vibrotactile signal collected by a tactile sensor from a bitstream according to one embodiment of the invention. The decoding apparatus 200 comprises a bitstream demultiplexing unit 44 configured to demultiplex the compressed block from the bitstream with side information, an inverse SPIHT (ISPIHT) unit 46 as a decompression unit configured to decompress the compressed block, a dequantization unit 48 configured to dequantize the decompressed block and an inverse DWT (IDWT) unit 50 as a third transforming unit configured to perform an inverse DWT of the dequantized signal.

Figure 7:
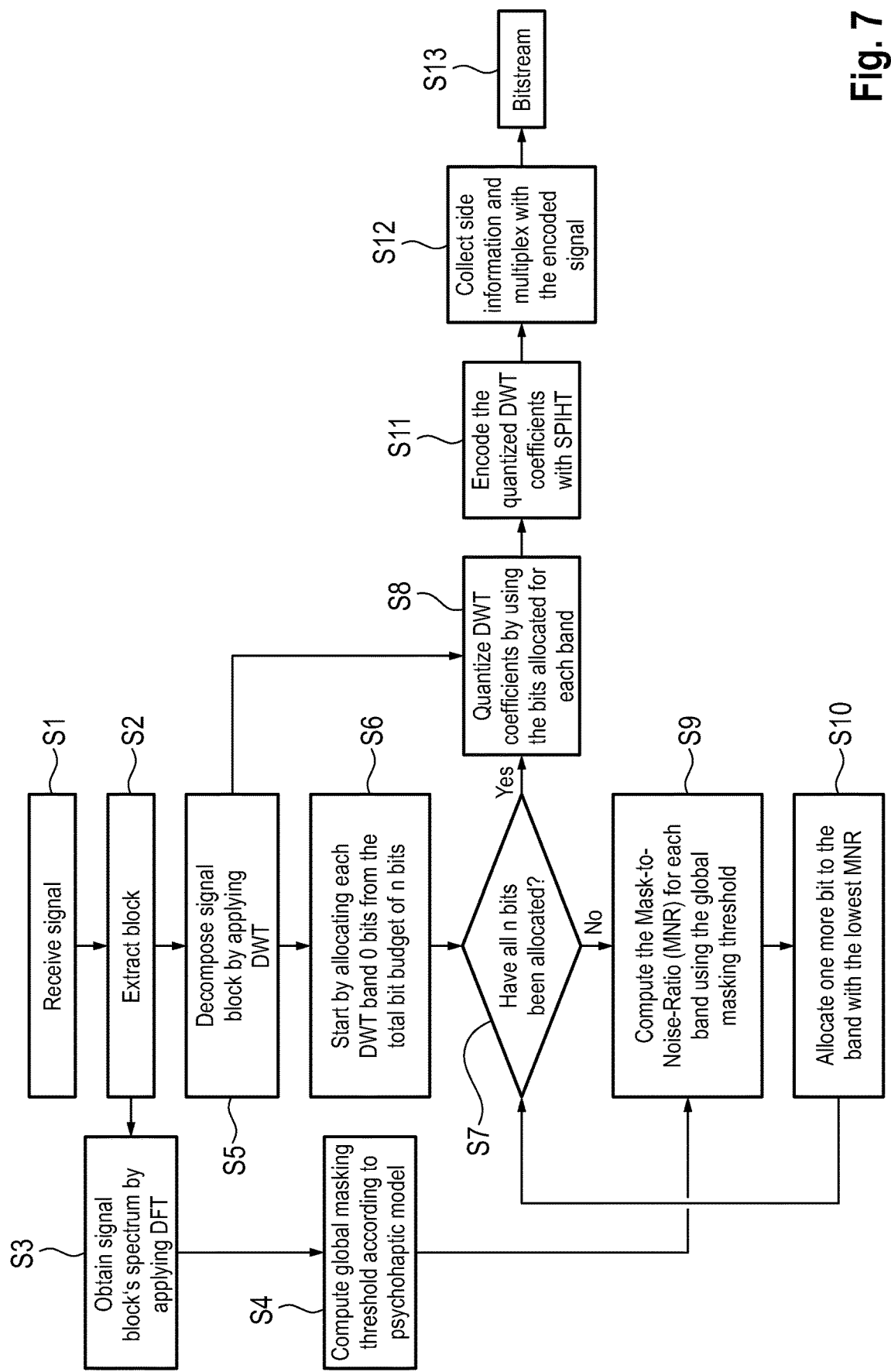
FIG. 7 show a flowchart of an encoding method for encoding a vibrotactile signal according to one embodiment of the invention.

FIG. 7 shows a flowchart of an encoding method for encoding a vibrotactile signal according to one embodiment of the invention.

In step S1, a vibrotactile signal is received. In step S2, the received signal is split into blocks. In step S3, the spectrum of the signal blocks is obtained by applying DFT. In step S4, a global masking threshold according to the inventive psychohaptic model is computed. In parallel to step S3, the signal blocks are decomposed by applying DWT (S5).

The quantization unit 10 allocates a certain bit budget to the different DWT bands according to the inventive psychohaptic model in order to reduce the rate considerably without introducing any perceivable distortion. In order to accomplish this task, the quantization unit 10 takes into account the SMR values from the psychohaptic model (resulting from step S4). In a loop shown in FIG. 7, a total of n bits are allocated to each band.

After step S5, it is started to allocate each DWT band 0 bits from the total bit budget of n bits (S6). In every iteration (S7, S9, S10), the SNR is calculated in dB using the signal energy values in each band passed over by the psychohaptic model and the noise energy introduced by the quantization. Then, the Mask-to-Noise-Ratio (MNR) is calculated with the formula "MNR=SNR−SMR" (S9). Then, one bit is allocated to the band with the lowest MNR value and repeat until all n bits are allocated.

Figure 12:
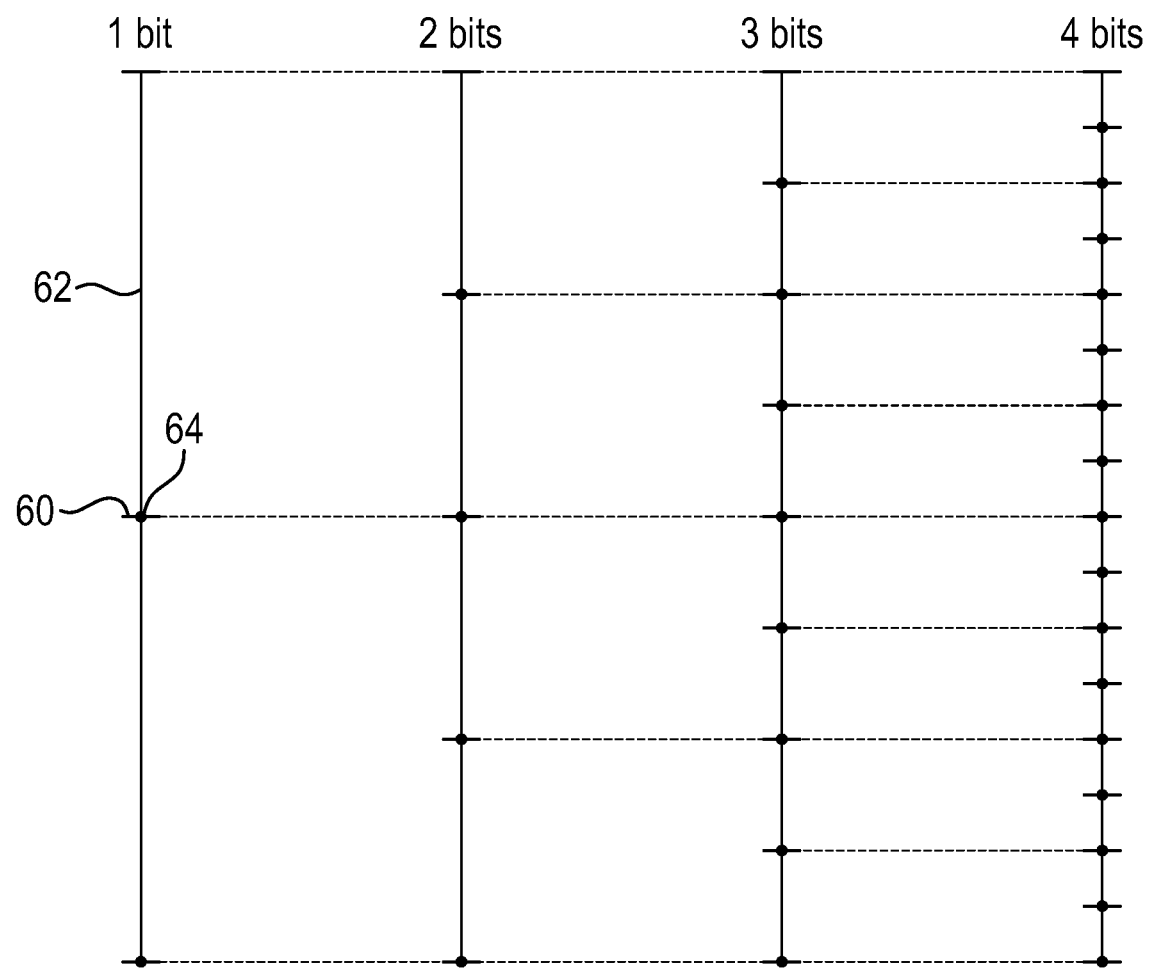
FIG. 12 shows a block diagram of a quantizer according to one embodiment of the invention.

An embodiment of a quantization unit 10 according to the invention, namely an embedded deadzone quantizer, is shown in FIG. 12. The quantization unit, as explained generally above, receives the DWT transform coefficients in the different frequency bands and the quantization control signal output by the psychohaptic model unit and representing the frequency-dependent masking threshold. In FIG. 12, the horizontal solid thick lines 60 represent the boundaries of each quantization interval 62. The round dots 64 represent the values to which the corresponding interval is quantized according to the procedure below. This principle is shown for four different numbers of quantizer bits.

The structure in FIG. 12 is beneficial, since in general the bands have a different number of quantizer bits. The maximum wavelet coefficient for the current block $w_{max}$ is calculated. This value is quantized to a fixed point number. If $w_{max}<1$, 7 fraction bits and no integer bits are used. For $w_{max} \geq 1$, 3 integer bits and 4 fraction bits by a ceiling operation to receive $\hat{w}_{max}$. One additional bit may be used for signaling whether $w_{max}$ is below or above 1. The 7 bits representing this maximum value are passed on to the bitstream encoding as side information. The quantization unit 10 then takes the bits allocated to each band and this maximum value to determine the quantization interval as $$\Delta = \frac{\hat{w}_{max}}{2^b},$$

where b is the number of bits allocated to a particular band. The wavelet coefficients are then quantized according to the formula $$w_q = \text{sgn}(w) \left\lfloor \frac{w}{\Delta} \right\rfloor \Delta.$$

Thus, the wavelet coefficients are quantized to the original range. This formula also implies the addition of one sign bit. After all bits have been allocated (S7) and therefore all wavelet coefficients have been quantized (S8), all the quantized wavelet coefficients are scaled to integers by $$w_{q,int} = w_q \frac{2^{b_{max}}}{\hat{w}_{max}}.$$

These quantized integer wavelet coefficients are passed on to the SPIHT algorithm to compress the signal (S11).

Afterwards, side information is collected and multiplexed with the encoded signal (S12) in order to generate a bitstream (S13).

Figure 8:
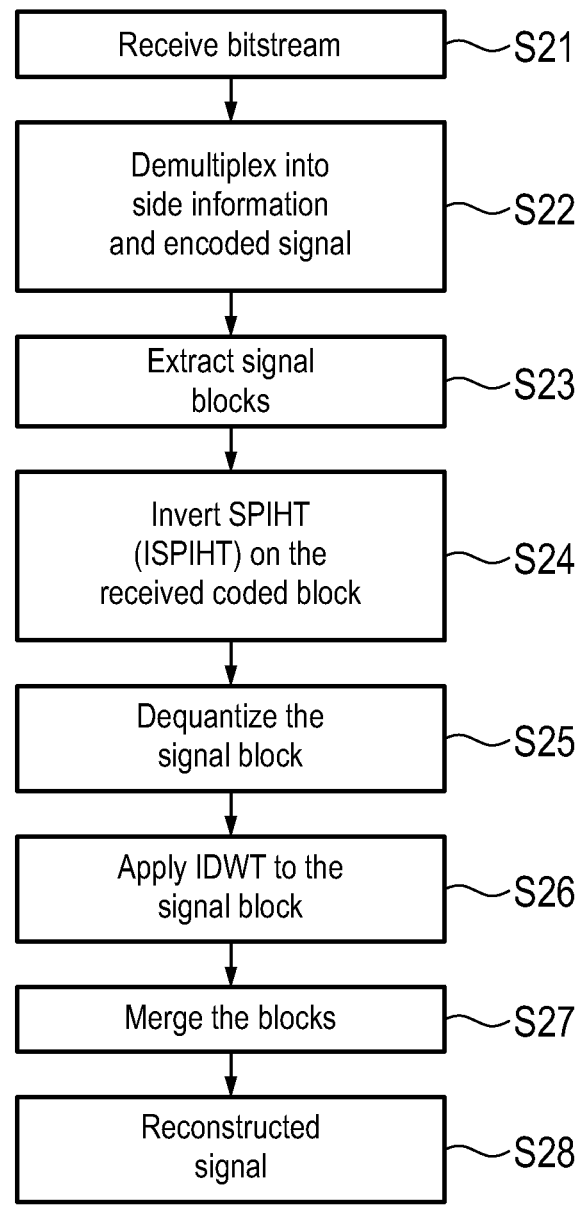
FIG. 8 shows a flowchart of a decoding method for decoding a vibrotactile signal from a bitstream according to one embodiment of the invention.

FIG. 8 shows a flowchart of a decoding method for decoding a vibrotactile signal from a bitstream according to one embodiment of the invention.

In step S21, a bitstream is received. In step S22, the received bitstream is demultiplexed into side information and encoded signal. In step S23, signal blocks are extracted from the encoded signal. In step S24, an ISPIHT is performed on the received encoded blocks in order to decompress the encoded blocks. In step S25, the decompressed blocks are dequantized. In step S26, an IDWT is applied to the dequantized signal blocks. Afterwards, the decoded blocks are merged (S27) to generate the reconstructed signal (S28).

Figure 9:
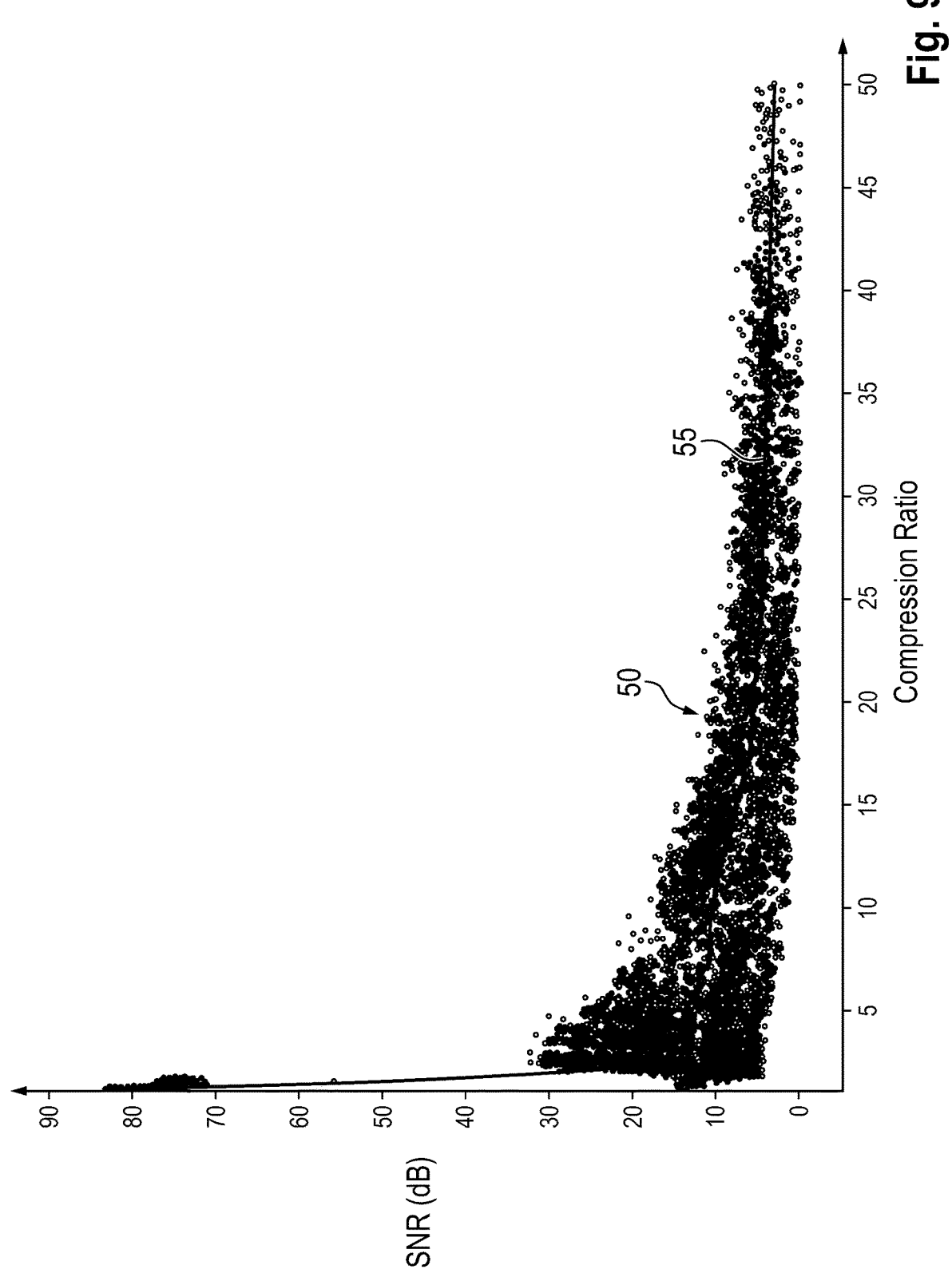
FIG. 9 shows the computed signal-noise-ratio (SNR) of 280 test signals for different compression ratio (CR)
Figure 10:
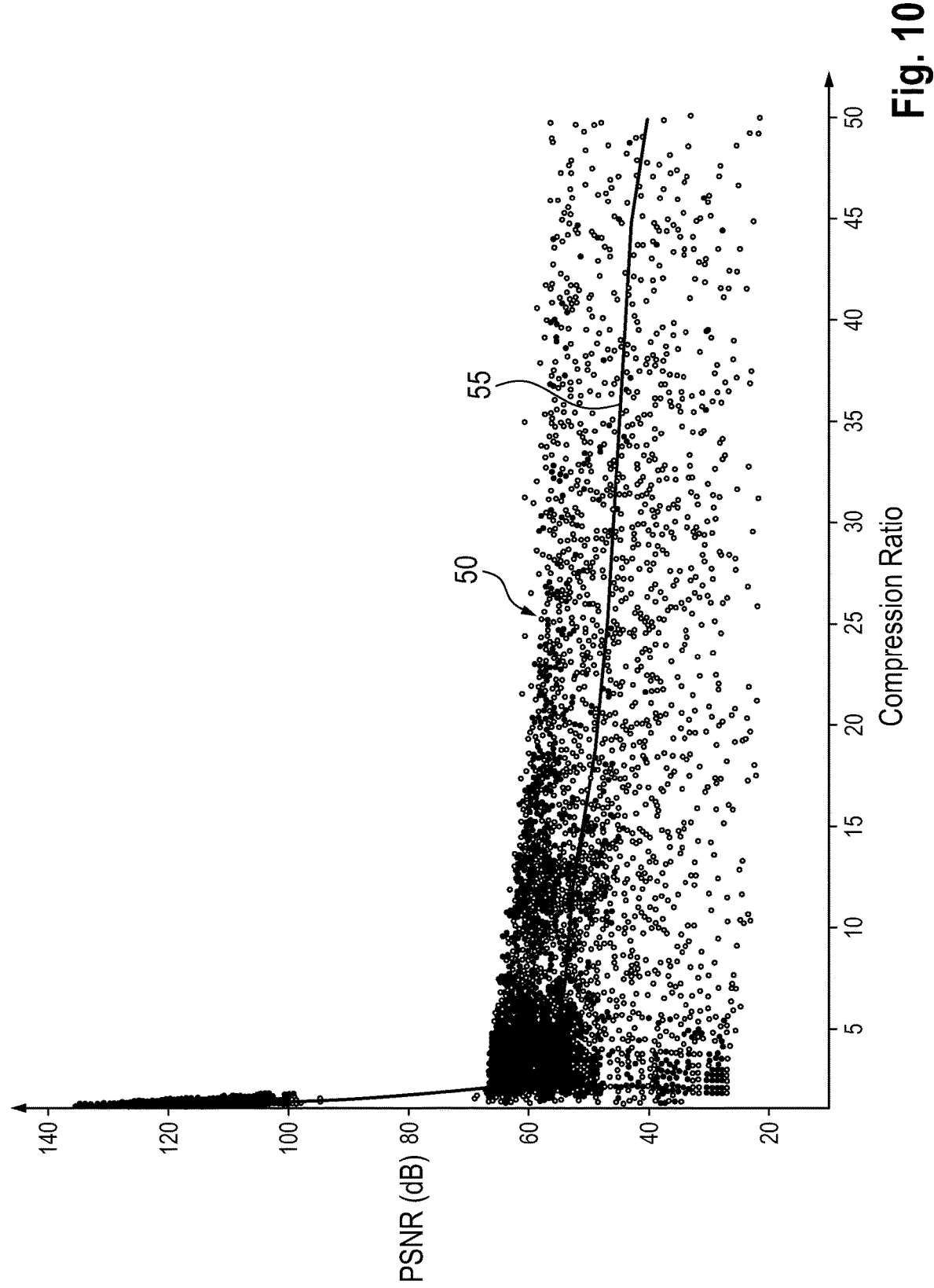
FIG. 10 shows the computed peak-signal-to-noise-ratio (PSNR) of the 280 test signals for different compression ratio (CR)

FIG. 9 and FIG. 10 show the computed signal-noise-ratio (SNR) and peak-signal-to-noise-ratio (PSNR) of 280 test signals for different compression ratio (CR) in order to show the performance of the inventive encoding/decoding apparatus/method.

In order to examining the rate-distortion-behavior, test data set consisting of 280 vibrotactile signals recorded with an accelerometer are encoded. The test dataset contains signals of various materials for different exploration speeds. the signals are compressed using a block length of 512 samples and a DWT of level 7.

All signals are encoded, decoded and the resulting output is then compared to the original. The bit budgets of the quantization unit 10 are varied between 8 and 128 bits to achieve different rates and therefore quality levels. The compression ratio (CR) is defined as the ratio between the original rate and the compressed rate. Afterwards, the SNR and PSNR are computed for all 280 test signals for different CR values. The respective scatter plots for all three metrics with averages are given in FIG. 9 and FIG. 10. As shown in FIG. 9 and FIG. 10, the solid points 50 are the scatter plots for all test signals at different rates, and the solid line 55 represents the average over all test signals. It is clear to see from FIG. 9 and FIG. 10 that the quality decreases with increasing compression. At a CR of 10, a SNR is about 10.5 dB and a PSNR is about 55 dB.

Figure 11:
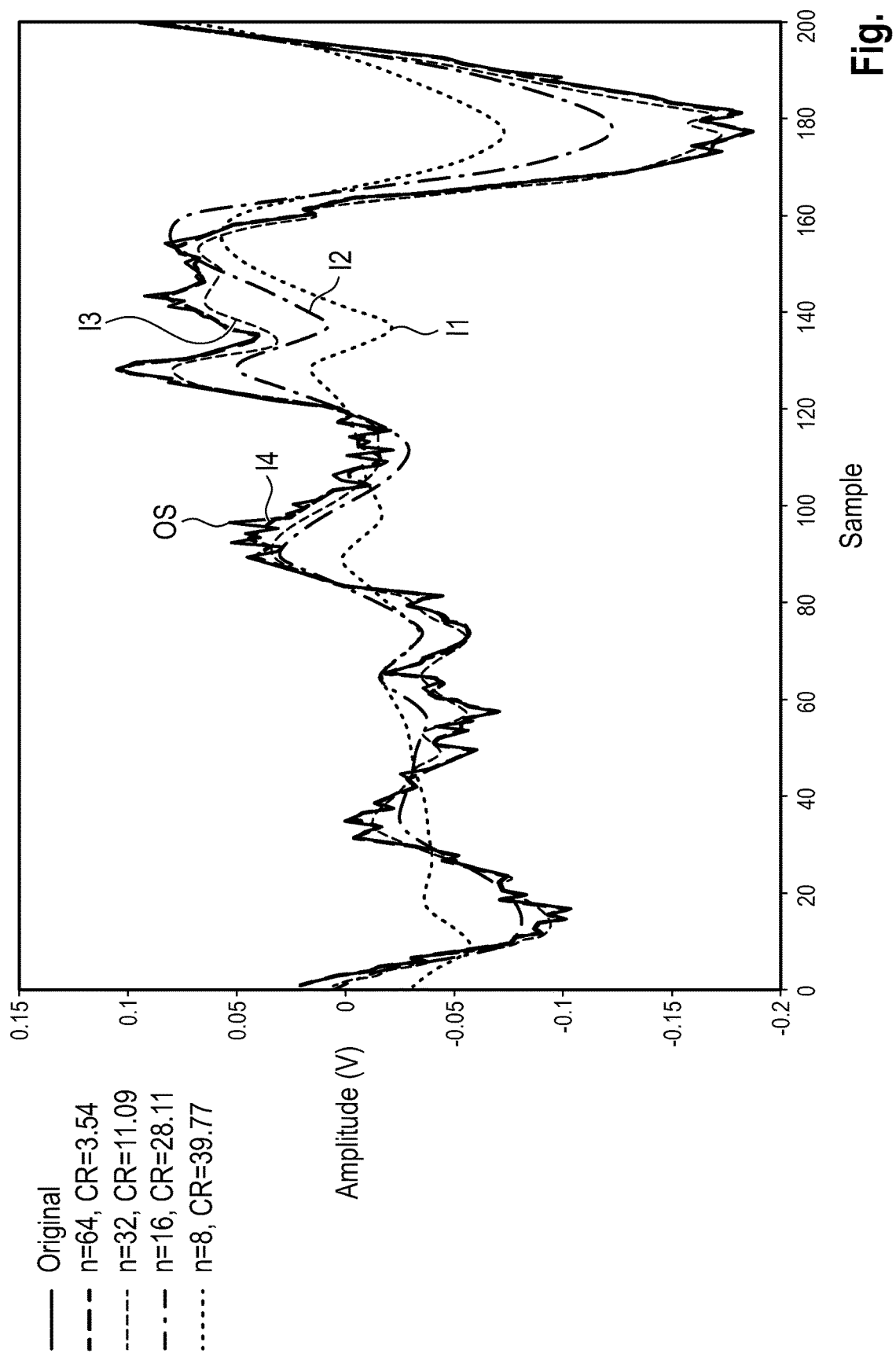
FIG. 11 shows a diagram depicting schematically the behavior of the inventive encoding/decoding apparatus/method towards the signal shape.

FIG. 11 shows a diagram depicting schematically the behavior of the inventive encoding/decoding apparatus/method towards the signal shape. This may help gaining some further intuition into how perceivable the introduced distortions are.

As shown in FIG. 11, an original signal (os) with its first 200 samples are plotted together with reconstructed signals for n=8 (I1), 16 (I2), 32 (I3), 64(I4). It can be seen from FIG. 11 that the general structure of the signal is preserved even for very high levels of compression (n=8 is equivalent here to CR≈39.77). At n=64, the two signals (os and I4) are so close that it can be assumed that no distortions should be perceivable.

Figure 13:
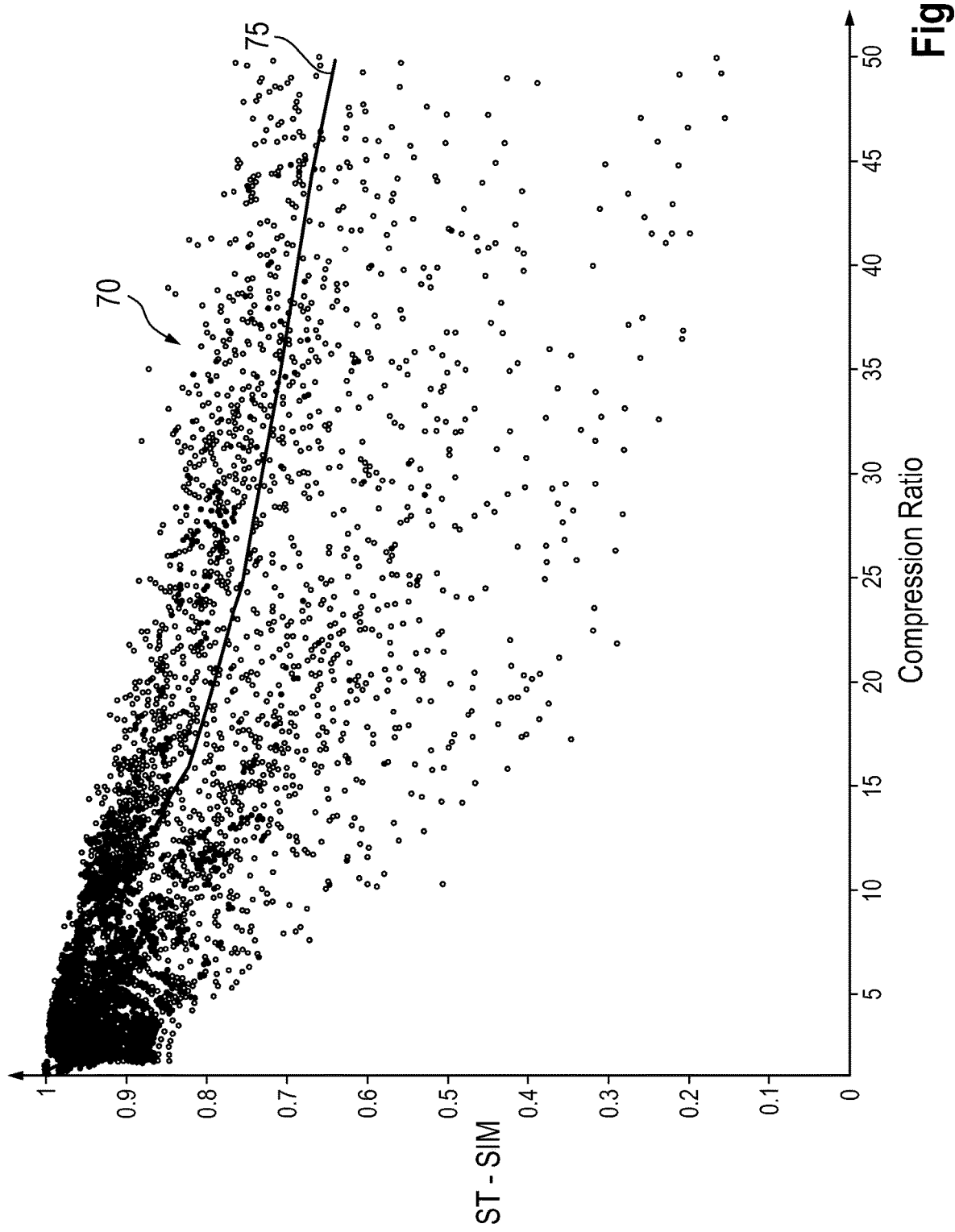
FIG. 13 shows the computed spectral temporal similarity (ST-SIM) of the 280 test signals for different compression ratio (CR).

FIG. 13 shows the computed spectral temporal similarity (ST-SIM) of the 280 test signals for different compression ratio (CR) in order to show the performance of the inventive encoding/decoding apparatus/method. The ST-SIM metric introduced in article "Vibrotactile signal compression based on sparse linear prediction and human tactile sensitivity function" by R. Hassen and E. Steinbach may be used to perform the computation.

As shown in FIG. 13, the solid points 70 are the scatter plots for all test signals at different rates, and the solid line 75 representing the average ST-SIM over all signals is a median, which avoids floor and ceiling effects. It is clear to see from FIG. 13 that the ST-SIM on average decreases gradually with increasing compression ratio. At a CR of 10, a median ST-SIM is about 0.903 (90.3%). This implies considerably good perceptual quality of the signals, and thus that the codec of the present invention is highly transparent.

INDUSTRIAL APPLICABILITY

Summarizing, the described invention provides encoding and decoding of vibrotactile signals with low noise and a small amount of data to be transmitted. Whilst the invention has been described with particular emphasis on IoT vibrotactile signals, the invention is of course generally applicable to the efficient transmission of tactile signals in other technological fields.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing," or any other variation thereof, are intended to cover a non-exclusive inclusion, such that a process, method, article, or apparatus that comprises, has, includes, contains a list of elements does not include only those elements, but may include other elements not expressly listed or inherent to such process, method, article, or apparatus. An element proceeded by "comprises . . . a," "has . . . a," "includes . . . a," or "contains . . . a," does not, without more constraints, preclude the existence of additional identical elements in the process, method, article, or apparatus that comprises, has, includes, or contains the element. The terms "a" and "an" are defined as one or more unless explicitly stated otherwise herein. The terms "substantially," "essentially," "approximately," "about," or any other version thereof, are defined as being close to as understood by one of ordinary skill in the art, and in one non-limiting embodiment the term is defined to be within 10%, in another embodiment within 5%, in another embodiment within 1%, and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors, and field programmable gate arrays (FPGAs), and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Software programs containing software instructions for carrying out the functionalities and method steps in the described units may be used. Therefore, one or more embodiments can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein, will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims.

In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

The invention claimed is:

1. An encoding apparatus for encoding a vibrotactile signal, comprising: a) a first transforming unit configured to perform a discrete wavelet transform of the signal; b) a second transforming unit configured to generate a frequency domain representation of the signal; c) a psychohaptic model unit configured to generate at least one quantization control signal based on the generated frequency domain representation of the sampled signal and on a predetermined perceptual model based on human haptic perception, wherein the psychohaptic model unit is configured to identify peaks in the signal spectrum, wherein each peak corresponds to a frequency and a magnitude, and wherein psychohaptic model unit comprises a memory adapted to store the frequency and magnitude of each identified peak; d) a quantization unit configured to quantize wavelet coefficients resulting from the performed discrete wavelet transform and adapted by the quantization control signal; e) a compression unit configured to compress the quantized wavelet coefficients; and f) a bitstream generating unit configured to generate a bitstream corresponding to the encoded signal based on the compressed quantized wavelet coefficients.

2. The encoding apparatus according to claim 1 further comprising a block unit configured to split the vibrotactile signal into a plurality of consecutive blocks.

3. The encoding apparatus according to claim 1 wherein the first transforming unit is adapted to perform the discrete wavelet transform by using a biorthogonal wavelet that comprises at least one of a Cohen-Daubechies-Feauveau-wavelet and a 9/7-Cohen-Daubechies-Feauveau-wavelet.

4. The encoding apparatus according to claim 1, wherein the second transforming unit is configured to generate the frequency domain representation by using a discrete Fourier transform, a fast Fourier transform, a discrete cosine transform or a discrete sine transform of the sampled signal.

5. A transmitter in a communication system comprising the encoding apparatus according to claim 1.

6. The encoding apparatus according to claim 1, wherein the psychohaptic model unit is configured to compute a masking threshold for the peaks at different frequencies based on the frequency and magnitude of each peak.

7. The encoding apparatus according to claim 1, wherein the psychohaptic model unit is further configured to compute an absolute threshold of perception at different frequencies which corresponds to an average signal magnitude required for human at a certain frequency to be able to perceive a signal.

8. The encoding apparatus according to claim 7, wherein the psychohaptic model unit is further configured to compute a global masking threshold based on the masking threshold and the absolute threshold.

9. The encoding apparatus according to claim 8, wherein the psychohaptic model unit is configured to compute a signal-to-mask-ratio based on the sum of the energy of the global masking threshold at different frequencies and on the energy of the signal, in particular to compute the signal-to-mask-ratio for each frequency band of the wavelet coefficients of the discrete wavelet transform.

10. The encoding apparatus according to claim 9, wherein the quantization unit is configured to quantize wavelet coefficients by allocating bits for each frequency band of the wavelet coefficients based on a mask-to-noise-ratio, wherein the mask-to-noise-ratio is computed based on the signal-to-mask-ratio and a signal-to-noise-ratio which is computed based on the energy of the signal and the energy of a noise introduced by the quantization.

11. The encoding apparatus according to claim 1, wherein the compression unit is adapted to use an algorithm based on set partitioning in hierarchical trees for the compression of wavelet coefficients.

12. The encoding apparatus according to claim 1, wherein the quantization unit is configured to be adapted by the quantization control signal such that the distortion introduced during the quantization of the sampled signal in different frequency ranges is, relative to a perception masking threshold of the perception model, not perceivable by a human.

13. The encoding apparatus according to claim 1, wherein the quantization unit comprises an embedded deadzone quantizer.

14. A decoding apparatus for decoding a vibrotactile signal from a bitstream, comprising: a) a decompression unit configured to decompress the bitstream, wherein in particular an algorithm based on inverse set partitioning in hierarchical trees is provided for the decompression; b) a dequantization unit configured to dequantize the decompressed bitstream, wherein the decompressed bitstream is quantized using a psychohaptic model unit configured to generate at least one quantization control signal based on a frequency domain representation of a sampled signal and on a predetermined perceptual model based on human haptic perception, wherein the psychohaptic model unit is configured to identify peaks in the signal spectrum, wherein each peak corresponds to a frequency and a magnitude, and wherein psychohaptic model unit comprises a memory adapted to store the frequency and magnitude of each identified peak; and a third transforming unit configured to perform an inverse discrete wavelet transform of the dequantized bitstream.

15. A receiver in a communication system comprising the decoding apparatus according to claim 14.

16. An encoding method for encoding a vibrotactile signal, comprising: a) performing a discrete wavelet transform of the signal; b) generating a frequency domain representation of the signal; c) generating at least one quantization control signal based on the generated frequency domain representation of the signal and on a predetermined perceptual model based on human haptic perception, wherein generating the quantization control signal includes using a psychohaptic model unit to identify peaks in the signal spectrum, wherein each peak corresponds to a frequency and a magnitude, and wherein psychohaptic model unit comprises a memory adapted to store the frequency and magnitude of each identified peak; d) quantizing wavelet coefficients resulting from the performed discrete wavelet transform and adapted by the quantization control signal; e) compressing the quantized wavelet coefficients; and f) generating a bitstream corresponding to the encoded signal based on the compressed quantized wavelet coefficients.

17. A computer program product comprising computer-executable instructions embodied in a non-transitory computer-readable medium which, when is executed by a processor of a computer, cause the computer to carry out the method of claim 16.

18. A decoding method for decoding a vibrotactile signal from a bitstream, comprising: a) decompressing the bitstream, wherein in an algorithm based on inverse set partitioning in hierarchical trees is provided for the decompression; b) dequantizing the decompressed bitstream, wherein the decompressed bitstream is quantized using a psychohaptic model unit configured to generate at least one quantization control signal based on a frequency domain representation of a sampled signal and on a predetermined perceptual model based on human haptic perception, wherein the psychohaptic model unit is configured to identify peaks in the signal spectrum, wherein each peak corresponds to a frequency and a magnitude, and wherein psychohaptic model unit comprises a memory adapted to store the frequency and magnitude of each identified peak; and c) performing an inverse discrete wavelet transform of the dequantized bitstream.

* * * * *